United States Patent [19]

Itagaki

[11] Patent Number: 4,461,037
[45] Date of Patent: Jul. 17, 1984

[54] AUTOMATIC TUNING SYSTEM FOR TELEVISION RECEIVER

[75] Inventor: Tsuguo Itagaki, Yokohama, Japan
[73] Assignee: Hitachi, Ltd., Tokyo, Japan
[21] Appl. No.: 291,476
[22] Filed: Aug. 10, 1981
[30] Foreign Application Priority Data Aug. 13, 1980 [JP] Japan .................... 55-110417

[51] Int. Cl.³ .............. H04B 1/26; H04N 5/44
[52] U.S. Cl. .................. 455/169; 455/182;
455/195; 358/191.1; 358/193.1
[58] Field of Search ............ 358/191.1, 193.1, 195.1;
455/150, 161, 164, 169, 182, 184, 192, 195

[56] References Cited

U.S. PATENT DOCUMENTS 4,240,114 12/1980 Fushimi .................. 358/193.1
4,240,115 12/1980 Kamiya .................. 455/169
4,328,517 5/1982 Watanabe ................ 358/193.1

Primary Examiner—Tommy P. Chin
Attorney, Agent, or Firm—Antonelli, Terry & Wands

[57] ABSTRACT

An automatic tuning system for a television receiver. A first binary-coded signal circuit comprising a plurality of comparators for encoding in a binary signal a signal output from a frequency discriminator is provided together with a second binary-coded signal circuit for encoding in a binary signal the presence and absence of a synchronizing signal in a signal from a synchronizing separation circuit and a signal from a deflector circuit. The first binary-coded signal circuit is connected to two first logic circuits, two flip-flops and a differentiating circuit, while the second binary-coded signal circuit is connected to two second logic circuits, two flip-flops and a differentiating circuit. Each of the flip-flops is reset by the output signal from the logic circuits actuated by said both binary-coded signals, and is set through a plurality of channel selecting switches operated by associated channel selecting buttons. A tuning voltage generating circuit is provided which comprises a high impedance amplifier and an integrating circuit. With such circuit arrangement, the tuning voltage applied to an electronic tuning type tuner is so controlled in dependence on the signal produced upon actuation of the channel selecting button that an optimum voltage level is automatically produce to thereby assure that a broadcast signal of the selected channel can be received in a constantly stabilized manner.

12 Claims, 2 Drawing Figures

AUTOMATIC TUNING SYSTEM FOR TELEVISION RECEIVER

BACKGROUND OF THE INVENTION

1. Field of the Invention

The present invention relates to an automatic tuning system for a television receiver.

2. Description of the Prior Art

In an automatic tuning system for a television receiver in which a broadcast program is automatically searched and received in a proper receiving state by pressing an associated channel selecting button, while actuation of another channel selecting button permits another broadcast program different from the one being received until then to be searched and received in the proper receiving state, there has been proposed a tuning voltage generator for an electronic tuning type tuner (hereinafter referred to also as an electronic tuning circuit) which generator is constituted by a capacitor connected between a tuning voltage terminal of the electronic tuning circuit and a grounded terminal or a terminal which is held at a fixed potential, a first constant current circuit for charging the capacitor and a second constant current circuit for discharging the capacitor, wherein the tuning voltage is increased or decreased by selecting either the the first or the second constant current circuits. Reference is to be made of U.S. Pat. No. 4,240,115 which corresponds to Japanese Laid-Open Patent Application No. 18119/1980.

In the automatic tuning circuit of this type, when the frequency being received approaches the broadcast signal frequency for the selected television channel, a normalized tuning frequency is detected on the basis of a combination of the output state of a frequency discriminator and the output state of a circuit designed for determining the presence or absence of the synchronizing signal in the signal being received. The normalized tuning frequency thus detected is utilized for controlling the switching of the constant current circuits thereby to automatically capture the broadcast signal of the selected channel. After the capture of the broadcast signal, the tuning voltage is increased and decreased in a repeated manner in correspondence to the binary-coded signal output from the frequency discriminator, resulting in that the tuning frequency is also repeatedly increased and decreased in a very narrow frequency range about the normal tuning frequency. With the hitherto known tuning system of the arrangement described above, even the instantaneous and transient variation or disturbance in the external electromagnetic wave conditions for the broadcast signal being received will trigger operation of a search circuit to displace the frequency in reception out of the very narrow frequency range, which in turn results in that the output conditions of the frequency discriminator and the synchronizing signal identifying circuit undergo variation. As the consequence, there may arise a case in which the broadcast signal, which has been received before the occurrence of the external disturbance, can not be captured again after such disturbance disappears.

The causes for such variations in the electromagnetic wave conditions may be explained by the fact that the location of the television receiver is changed, a room antenna is changed in position or orientation, a person passes by the room antenna or the like fact. The problem is likely to occur particularly in the case of a small type television receiver which incorporates therein the automatic tuning system described above.

SUMMARY OF THE INVENTION

An object of the present invention is to provide an automatic tuning system which is capable of capturing a broadcast signal received for a selected channel even when the broadcast signal disappears temporarily due to disturbance in the external receiving conditions.

With a view to attaining the object stated above, it is proposed according to a feature of the present invention that a DC voltage determined by a charge voltage of a capacitor, which undergoes substantially no variation unless a current is externally supplied to the capacitor, is used as a tuning voltage of an electronic tuning type tuner. When the frequency being received by the tuner departs from a predetermined frequency range, a current supply path is connected to the capacitor only for a predetermined period for varying the charge voltage of the capacitor so that the frequency being received varies in the direction opposite to the direction of the frequency deviation, whereby the frequency in reception is re-established in the vicinity of the center frequency of a predetermined receive frequency range.

DESCRIPTION OF THE PREFERRED EMBODIMENT

Figure 1:
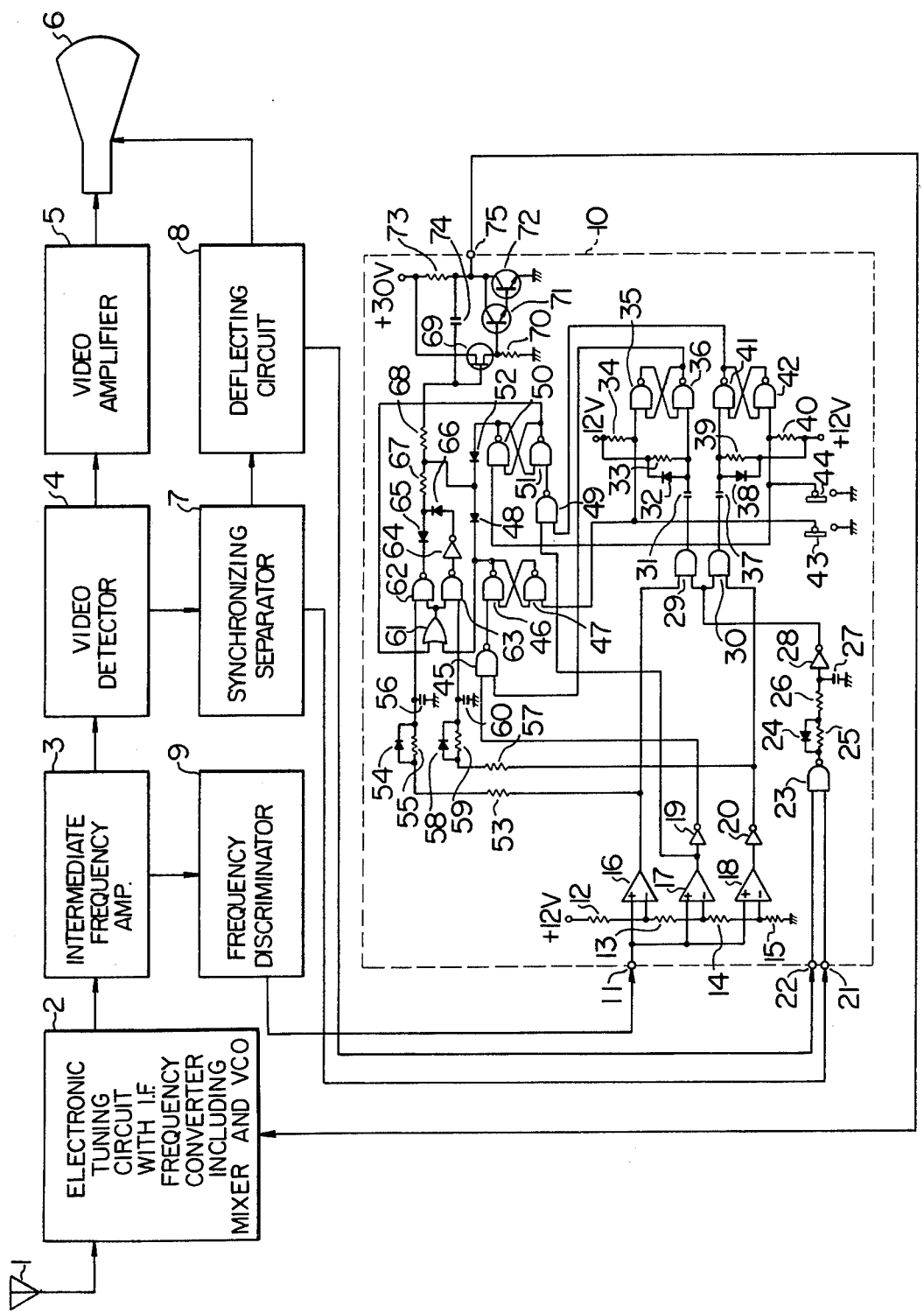
FIG. 1 shows a circuit diagram of an automatic tuning system according to an exemplary embodiment of the invention together with a television receiver circuit shown in a block diagram.

Referring to FIG. 1 which shows a circuit arrangement of a television receiver which incorporates an automatic tuning circuit according to an embodiment of the present invention, reference numeral 1 denotes an antenna, 2 denotes an electronic tuning circuit, 3 denotes an intermediate frequency amplifier, 4 denotes a video detector, 5 denotes an amplifier, 6 denotes a cathode ray tube, 7 denotes a synchronizing signal separation circuit, 8 denotes a deflecting circuit, 9 denotes a frequency discriminator, and a numeral 10 denotes an automatic tuning circuit. The electronic tuner includes a frequency converter which may have a mixer that has an input coupled to antenna 1 and an output coupled to the intermediate frequency amp 3 and a variable frequency input which is provided by a voltage controlled oscillator that has an input coupled to point 75. The automatic tuning circuit 10 receives as input signals thereto an output signal from the frequency discriminator 9, an output signal from the synchronizing separation circuit 7 and a horizontal blanking pulse signal available from the deflecting circuit 8, and produces a tuning voltage which is supplied to the electronic tuning circuit 2. In the following, description will be made in detail on the automatic tuning circuit 10. In FIG. 1, reference numeral 11 designates an input terminal to which a voltage corresponding to a frequency difference between a carrier frequency converted to a video intermediate frequency signal and a preset center frequency (e.g. 45.75 MHz) is supplied from the frequency discriminator 9. Reference numerals 16, 17 and 18 denote comparators, respectively, 19 and 20 denote inverter circuits, and 12, 14 and 15 denote reference bias resistors for establishing reference biases for the comparators 16, 17 and 18, respectively. The circuit components 12 to 20 constitute a circuit which serves for converting the output signal from the frequency discriminator 9 into a binary signal. A voltage $V_1$ derived at a junction of the resistors 12 and 13 represents a threshold voltage which is higher than a mid-point or center voltage of the output signal having a reversed S-like waveform produced from the frequency discriminator 9 and is applied to an inverting input terminal (or minus terminal) of the comparator 16. When the output voltage from the frequency discriminator 9 applied to a non-inverting input terminal of the comparator 16 is higher than the threshold voltage $V_1$, the output of the comparator 16 is at a high level or "H" level. Otherwise, the output signal from the comparator 16 is at a low level or "L" level. In a similar manner, a voltage $V_2$ appearing at a junction between the resistors 13 and 14 represents a threshold voltage which corresponds to the center voltage of the reversed S-like waveform signal output from the frequency discriminator 9. Further, a tap voltage $V_3$ appearing at a junction between the resistors 14 and 15 represents a threshold voltage which is lower than the midpoint or center voltage of the reversed S-like waveform signal output from the frequency discriminator 9.

In FIG. 1, a reference numeral 21 denotes an input terminal for a synchronizing signal, 22 denotes an input terminal for the horizontal blanking pulse signal, 23 denotes a NAND gate for producing a logical product signal from the synchronizing signal and the horizontal blanking pulse signal applied to the NAND gate 23, 27 denotes a charge capacitor, 25 and 26 denote resistors effective for charging and discharging the capacitor 27, 24 denotes a diode which functions to change the time constant at which the capacitor 27 is charged and discharged, respectively, and numeral 28 denotes an inverter circuit. When there is no normal synchronizing signal present in the output signal from the video detector 4, the voltage signal appearing at the input terminal 21 and the voltage signal making appearance at the input terminal 22 do not exceed the threshold voltage level of the NAND circuit 23 at an identical time i.e. simultaneously, resulting in that the output voltage from the NAND circuit 23 is at the "H" level. As the consequence, the capacitor 27 is charged to the "H" level, whereby the output terminal of the inverter circuit 28 is at the "L" level. On the other hand, when the normal synchronizing signal is present in the output signal from the video detector 4, the voltage signals appearing at the input terminals 21 and 22 become periodically and simultaneously at the "H" level, resulting in that the output signal from the NAND circuit 23 takes periodically the low or "L" level. In this manner, the capacitor 27 is charged through the resistors 25 and 26 during a period in which the synchronizing signal is absent, while the capacitor 27 is discharged through the resistor 26 and the diode 24 every time the synchronizing signal makes appearance. In this connection, it is to be noted that the resistance value of the resistor 26 is selected sufficiently smaller than that of the resistor 25 so that when the normal synchronizing signal is present, the voltage appearing across the capacitor 27 is lower than the threshold voltage level of the inverter circuit 28, thereby to render the output voltage from the inverter circuit 28 to be at the "H" level.

A reference numeral 29 denotes an AND circuit which is adapted to produce an output signal of the high or "H" level, provided that the synchronizing signal is present and that the output voltage from the frequency discriminator 9 is lower than the threshold voltage $V_1$ of the comparator 16. Otherwise, the AND circuit 29 produces the output signal of the "L" level. On the other hand, an AND circuit designated by 30 is adapted to produce an output signal of the "H" level, provided that the synchronizing signal is present and that the output voltage from the frequency discriminator 9 becomes lower than the threshold voltage $V_3$ of the comparator 18. Otherwise, the AND circuit 30 produces the output signal of the "L" level.

There is provided a differentiating circuit which is constituted by a capacitor 31, a diode 32 and a resistor 33 and which serves for detecting a negative-going transition (i.e. transition from the "H" level to the "L" level) of the output voltage produced from the AND gate 29. The diode 32 is operative to clamp the positive going pulse of the differentiated waveform at + (plus) 12 V. NAND circuits 35 and 36 constitute cooperatively a flip-flop circuit which is reset in response to the negative-going transition of the output voltage from the NAND circuit 29, and set in response to operation of a channel selection switch 43. In a similar manner, a differentiating circuit composed of a capacitor 37, a diode 38 and a resistor 39 serves to detect the negative-going transition (i.e. transition from "H" to "L" level) of the output voltage from the AND circuit 30. NAND circuits 41 and 42 constitute a flip-flop circuit which is reset in response to the negative-going transition of the output signal from the AND gate and set in response to operation of a channel selection switch 44. The resistor 40 serves as a bias resistor for the NAND circuits 42 and 50.

The channel selection switch 43 mentioned above may be constituted by a push button switch having contacts which are closed by pressing the push button when a channel for which the tuning voltage is higher than that of the channel being currently in reception is to be selected. In a similar manner, the channel selecting switch 44 has contacts which are closed by pressing an associated push button when the channel currently being selected is to be changed over to a channel for which the tuning voltage is lower than that of the currently selected channel.

A NAND circuit 45 produces an output signal of the "L" level, when the flip-flop constituted by the NAND gates 35 and 36 is reset in response to the negative-going transition of the output voltage from the AND circuit 29 and simultaneously the output voltage from the frequency discriminator 9 is lower than the threshold voltage $V_2$ of the comparator 17. Otherwise, the NAND circuit 45 produces the output signal of the "L" level. NAND circuits 46 and 47 constitute a flip-flop which is set in response to actuation of the channel selection switch 43 and reset when the output signal from the NAND circuit 45 takes the low or "L" level. A diode 48 is rendered conductive, when the output signal from the NAND circuit 46 is at the "L" level, that is, when the flip-flop constituted by the NAND gates 46 and 47 is in the set state, while the diode 48 is non-conductive when the above flip-flop is in the reset state. A NAND circuit 49 is adapted to produce the "L" level output, when the flip-flop constituted by the NAND circuits 41 and 42 is reset in response to the negative-going transition of the output voltage from the AND circuit 30 and at the same time the output voltage from the frequency discriminator 9 is lower than the threshold voltage $V_2$ of the comparator 17. Otherwise, the output from the NAND circuit 49 is at the "L" level. NAND circuits 50 and 51 constitute a flip-flop which is set in response to operation of the channel selection switch 44 and reset when the output from the NAND circuit 49 is at the "L" level. A diode 52 is caused to be conductive, when the output from the NAND circuit 50 is at the "H" level, i.e. when the flip-flop constituted by the NAND circuits 50 and 51 is in the set state, and blocked when the same flip-flop is in the reset state. Resistors 53 and 55, a diode 54 and a capacitor 56 constitute a delay circuit for delaying the time point at which the negative-going transition of the output voltage from the comparator 16 occurs. The resistance of the resistor 53 is selected to be smaller than that of the resistor 55 so that a voltage drop appearing across the capacitor 56 is delayed relative to the negative-going transition of the output voltage from the comparator 16. In a similar manner, resistors 57 and 59, a diode 58 and a capacitor 60 constitute a delay circuit for delaying the decrease in voltage across the capacitor 60 relative to the negative-going transition of the output voltage from the inverter circuit 20. An OR circuit 61 is adapted to produce an output signal of the "H" level, when the flip-flop constituted by the NAND circuits 46 and 47 is in the reset state or when the flip-flop constituted by the NAND circuits 50 and 51 is in the reset state. When both of these flip-flops are in the set state, the OR circuit 61 produces the output of the "L" level. A NAND circuit 62 produces an output signal of the "L" level, when the output from the OR circuit 61 is at the "H" level and at the same time the output from the comparator 16 is at the "H" level or during a period which begins at the negative-going transition of the output signal from the comparator 16 and duration of which is determined by a time constant provided by the resistors 53 and 55 and the capacitor 56, that is, during a time required for the terminal voltage of the capacitor 56 to be lowered below the threshold level of the NAND circuit 62. Otherwise, the output signal from the OR circuit 61 remains at the "H" level. In a similar manner, the NAND circuit 63 produces an output signal of the "L" level when the output from the OR circuit 61 is at the "H" level and at the same time the output from the inverter circuit 20 is at the "H" level or during a period which begins at the negative-going transition of the output signal from the inverter circuit 20 and whose length is determined by a time constant provided by the resistors 57 and 59 and the capacitor 60, i.e. during the period in which the terminal voltage appearing across the capacitor 60 is lowered below the threshold voltage level of the NAND circuit 63. Otherwise, the output from the NAND circuit 63 remains at the "H" level. An inverter circuit 64 is operative to invert the output signal from the NAND circuit 63. A diode 65 becomes conductive when the output from the NAND circuit 62 is at the "L" level and is blocked when the latter is at the "H" level. A diode 66 is conductive when the output from the inverter 64 is at the "H" level and becomes non-conductive when the latter is switched to the "L" level.

A tuning voltage generating circuit is constituted by a field effect transistor of FET 69, transistors 71 and 72, resistors 70 and 73, a capacitor 74 and resistors 67 and 68 in a form of a Miller integrator in which the capacitor 74 is connected in a feedback path leading from the output to the input side of an amplifier exhibiting a high input impedance. The transistors 71 and 72 are connected in a Darlington connection so as to assure a high amplification factor. The FET 69 is used to assure the high input impedance. With such circuit arrangement, there can be produced at an output terminal 75 a voltage signal of a triangular wave form which is decreased or increased linearly in response to a step-like input signal applied to the gate of the field effect transistor or FET 69.

The voltage signal thus produced at the output terminal 75 is supplied to a tuning terminal of the electronic tuning circuit as an automatic tuning control voltage signal.

Figure 2:
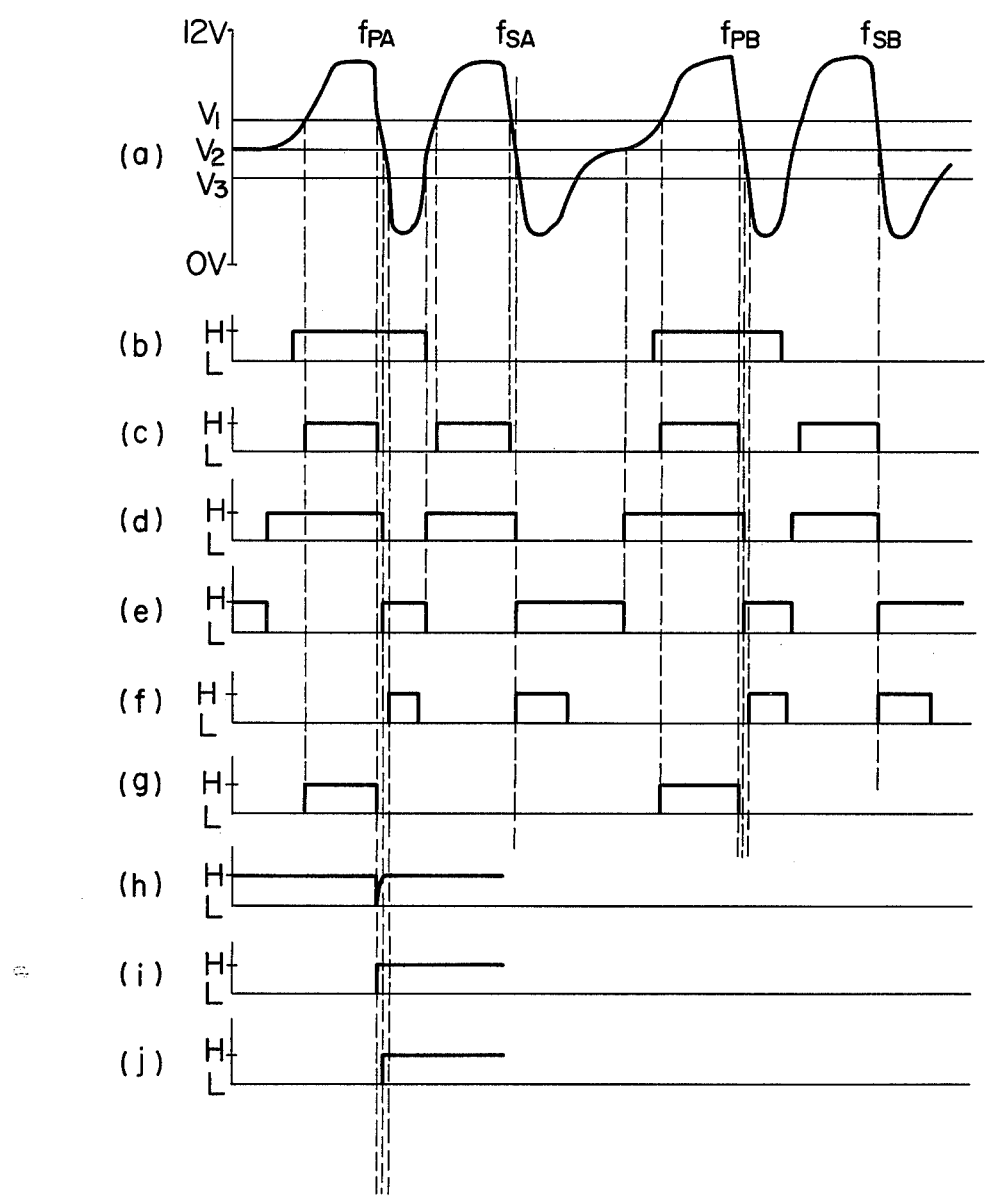
FIG. 2 illustrates in waveform diagrams signals produced in major circuit portions shown in FIG. 1.

Next, operation of the automatic tuning circuit 10 will be described. When the channel selection switch 43 is actuated to thereby close the contacts thereof, the flip-flop constituted by the NAND circuits 35 and 36 as well as the flip-flop constituted by the NAND circuits 46 and 47 are set, resulting in that the output from the NAND circuit 36 is at the low or "L" level with the one of the inputs to the NAND circuit 45 being at the "L" level. Consequently, the output signal from the inverter circuit 19 is prevented from being supplied to the input of the NAND circuit 46, whereby the output from the NAND circuit 46 is at the "L" level to thereby allow the diode 48 to be conductive. In these conditions, electric charge stored in the capacitor 74 is discharged through the resistor 68, as the result of which the voltage appearing at the terminal 75 is caused to be progressively shifted toward a range of higher reception frequencies. It is now assumed that there are a channel A and a channel B with the latter being allotted with a higher frequency than that of the latter. Under the assumption, the output signal from the frequency discriminator 9 shown in FIG. 1 undergoes variation as illustrated by a waveform in FIG. 2 at a, in which $V_1$, $V_2$ and $V_3$ represent the threshold voltage levels of the comparators 16, 17 and 18, respectively, as described hereinbefore, while $f_{PA}$ represents a video carrier frequency for the channel A, $f_{SA}$ represents a sound carrier frequency for the channel A, $f_{PB}$ represents the video carrier frequency for the channel B, and $f_{SB}$ represents the sound carrier frequency for the channel B. In FIG. 2, there is illustrated at b an output voltage waveform produced from the NAND circuit 23, wherein the period of the "H" level corresponds to the period during which the synchronizing signal is present. In FIG. 2 at c, there is illustrated an output voltage from the comparator 16, while an output voltage from the comparator 17 is illustrated at d in FIG. 2, an output voltage from the inverter circuit 19 is illustrated at e, and an output voltage waveform of the inverter circuit 20 is illustrated at f.

Assuming now that the channel selection switch 43 is manually turned on to increase the channel select receive frequency for selecting the channel A starting from a channel of a lower frequency than that of the channel A, the AND circuit 29 produces the output voltage of a waveform illustrated at g in FIG. 2 when the channel select receive frequency approaches the normalized receive frequency associated with the channel A. As a result, the output voltage from the frequency discriminator 9 is increased beyond the threshold level $V_1$ and lies below that level $V_1$ in the vicinity of the normalized reception frequency. At that time, the signal which is applied to the input of the NAND circuit 36 by way of the differentiating circuit composed of the capacitor 31, the diode 32 and the resistor 33 is of such a waveform as illustrated in FIG. 3 at h. As the consequence, the flip-flop which is constituted by the NAND circuits 35 and 36 and has been set in response to the operation of the channel select switch 43 is reset upon the negative-going transition of the output voltage from the AND circuit 29, whereby the output voltage from the NAND circuit 36 is changed to the "H" level as illustrated in FIG. 2 at i. Since one of the inputs to the NAND circuit 45 is then at the "H" level, the input signal to the NAND circuit 46 is controlled in dependence on the output level of the inverter circuit 19. Accordingly, at the instant when the output from the inverter circuit 19 takes the "H" level, i.e. when the output voltage from the frequency discriminator 9 becomes lower than the threshold level $V_2$, the flip-flop constituted by the NAND circuits 46 and 47 are reset, with the result that the output signal from the NAND circuit 46 becomes at the "H" level as illustrated at j in FIG. 2, while the diode 48 is blocked. At that time, the output from the OR circuit 61 is at the "H" level. However, since the charge voltages of the capacitors 56 and 60 are at the "L" level, the diodes 56 and 60 are blocked. The flip-flop constituted by the NAND circuits 50 and 51 is reset at the time of initialization in the similar manner as the other flip-flops, the output signal from the NAND circuit 50 is at the "L" level, rendering the diode 52 to be non-conductive. In other words, all the diodes 48, 52, 65 and 66 are blocked at the instant when the output voltage from the frequency discriminator 9 exceeds the center or mid-point voltage $V_1$, resulting in that the input to the tuning voltage generator circuit is inhibited. The gate voltage of the field effect transistor 69 undergoes only a slight variation due to the input leakage current of the FET 69 and leakage currents at the diodes 48, 52, 65 and 66. Consequently, the voltage at the terminal 11 is held in the vicinity of the center or mid-point voltage $V_1$.

It is now assumed that the reception frequency is shifted toward a lower frequency for some cause such as leakage current or a drift in a frequency of local oscillation, for example. Under the above assumption, the outputs of the NAND circuits 62 and 63 are controlled by the outputs of the comparators 16 and 18, since the output signal from the NAND circuit 46 is at the "H" level. At the instant when the output signal from the frequency discriminator 9 exceeds the threshold level $V_1$ as the reception frequency is shifted toward the lower frequency, the output signal from the comparator 16 takes the "H" level. As the consequence, the capacitor 56 is charged through the resistor 53 and the diode 54. Because the resistance value of the resistor 53 is selected sufficiently small, the terminal voltage appearing across the capacitor 56 is increased in a short time to such a level that the output from the NAND circuit 62 is switched from the "H" level to the "L" level, resulting in that the diode 65 becomes conductive. As the consequence, the gate voltage of the field effect transistor 69 is lowered, while the voltage at the tuning terminal 75 is caused to rise, causing the reception frequency to be increased. Then, the output voltage of the frequency discriminator 9 is decreased below the threshold voltage $V_1$ and approaches to the center voltage of the reversed S-like waveform signal described hereinbefore. In this manner, a negative feedback operation, so to say, takes place. Since the discharging of the capacitor 56 is effected slowly in contrast to the charging of the same capacitor which is effected rapidly, the charge level of the capacitor is maintained at the "H" level and the trend of the output voltage from the frequency discriminator 9 being lowered is also sustained, even when the output voltage from the frequency discriminator becomes again lower than the threshold voltage $V_1$ after having exceeded once that threshold voltage $V_1$. In this connection, it should be mentioned that the time constant provided by the resistors 53 and 55 and the capacitor 56 is so selected that the charge voltage of the capacitor 56 is maintained at the "H" level for a time duration which is required for the output voltage of the frequency discriminator 9 to resume the level approximating the threshold voltage $V_2$.

When the frequency in reception is deviated toward a higher frequency, the output level of the inverter circuit 20 varies correspondingly, resulting in that the tuning voltage appearing at the tuning terminal 75 is lowered to thereby cause the reception frequency to be decreased.

From the foregoing description, it will be appreciated that, when a broadcast frequency signal is once captured, the charge and discharge path of the capacitor is opened. By virtue of this feature and additionally due to the fact that the output voltage from the frequency discriminator 9 is at the level of the center voltage $V_2$ in the quiescent state, the tuning voltage can be positively prevented from being varied, even when the broadcast signal is temporarily interrupted or when the electric field for the program being in reception is temporarily weakened. In reality, so far as such reception interference state continues only for a relatively short duration (e.g. on the order of several seconds to several ten seconds), a stable reception can be assured upon catching again the broadcast signal.

Next, description will be made on operation for selecting the channel B by increasing the reception frequency from the state in which the channel A is selected. In this case, the reversed S-like waveform makes appearance in the output signal from the frequency discriminator 9 even in the vicinity of the sound carrier frequency $f_{SA}$ of the channel A. At that time, the synchronizing signal is not detected. Consequently, the gates of the AND circuits 29 and 30 are closed, whereby the reception frequency is increased to that for the channel B and stabilized in the vicinity of the video frequency $f_{PB}$ through the procedures described hereinbefore.

When the reception frequency is to be decreased, the channel selecting switch 44 is actuated. Then, the flip-flop constituted by the NAND circuits 41 and 42 as well as the flip-flop constituted by the NAND circuits 50 and 51 are set, resulting in that the output signal from the NAND circuit 41 is at the "L" level, while one of the inputs to the NAND circuit 49 is at the "L" level, whereby the output signal from the comparator 17 is inhibited from being supplied to the input of the NAND circuit 51. This results in the "H" level of the output from the NAND circuit 50. Consequently, the diode 52 becomes conductive to allow the capacitor 74 to be charged through the resistor 68, involving that the voltage at the tuning terminal 75 is progressively lowered to thereby displace the reception frequency toward a lower frequency.

As will be appreciated from the foregoing description, the present invention teaches that the time constant is varied for the charge and the discharge of the capacitor 74 in the search mode and the stabilized state, respectively, in such a manner that the tuning voltage is varied at a high rate in the search mode, while in the stabilized state the tuning voltage is varied at a low rate. This is accomplished by changing over correspondingly the charge and the discharge resistors (i.e. 67 and 68). According to the invention, the program reception can be accomplished in an excellently stabilized manner.

The automatic tuning apparatus according to the invention can assure a stabilized reception with conventional and inexpensive components even in the case where the electromagnetic wave condition should undergo variations. Thus, the invention provides a great contribution in the field of this art.

I claim:

1. An automatic tuning system, comprising:
   (a) an electronic tuning means including a frequency converter means having a control terminal supplied with a DC voltage for determining a frequency to be received, said frequency converter means converting a signal received by said electronic tuning means into an intermediate frequency signal;
   (b) a frequency discriminator means supplied with said intermediate frequency signal for producing a discrimination signal, said discrimination signal having a magnitude which has a center value when a frequency of said intermediate frequency signal is equal to a predetermined frequency and changes between an upper limit and a lower limit in accordance with a frequency deviation of said intermediate frequency signal from said predetermined frequency;
   (c) voltage generating means having an output terminal coupled to said control terminal and a charge storage means for causing the generation of said DC voltage at said output terminal, said DC voltage being a function of the charge voltage stored by said charge storage means;
   (d) current supplying means for supplying a current to said charge storage means to vary the charge voltage stored by said charge storage means;
   (e) detection means supplied with said discrimination signal for generating a detection signal when said discrimination signal is beyong said limits; and
   (f) control means, responsive to said detection signal, for rendering said current supplying means to be operative for a predetermined duration to cause said magnitude of said discrimination signal to approach toward said center value.

2. An electronic tuning system set forth in claim 1, wherein said current supplying means comprises a first current supply circuit for causing a current to flow in a first direction relative to said charge storage means and a second current supply circuit for causing a current to flow in a second direction opposite to said first direction relative to said charge storage means, and said control means connects said first current supply circuit to said charge storage means for a predetermined period from the time said discrimination signal exceeds said upper limit and connects said second current supply circuit to said charge storage means for a predetermined period from the time said discriminating voltage exceeds said lower limit.

3. An electronic tuning system as set forth in claim 1, further including other current supplying means and channel selector means, wherein said channel selector means through manual operation thereof causes said other current supplying means to be connected to said charge storage means and at the same time causes said control means to be in an inoperative state, to thereby cause said discriminating signal to depart from a range between said upper and lower limits in order to vary the charge voltage of said charge storage means to capture another broadcast signal, and wherein when said discriminating signal becomes equal to said center value, said other current supplying means is disconnected from said charge storage means, while said control means is restored to the operative state, to thereby capture said another broadcast signal.

4. An electronic tuning system set forth in claim 3, wherein a value of the current generated by said current supplying means is smaller than a value of the current produced by said other current supplying means.

5. An electronic tuning system set forth in claim 1, 2, 3 or 4, wherein said voltage generating means includes an amplifier circuit having a high input impedance, and said charge storage means is connected between the input and the output of said amplifier.

6. An electronic tuning system in accordance with claim 5 wherein said charge storage means is a capacitor.

7. An automatic tuning system in accordance with claim 1, wherein said frequency converter means comprises a voltage controlled oscillator coupled to said control terminal which is coupled to said output terminal of said voltage generating means to vary the frequency of oscillation of said oscillator as a function of the voltage applied to said control terminal and a mixer coupled to said oscillator, said mixer being coupled to a signal source of signals to be received and to said frequency discriminator means for supplying said intermediate frequency signal.

8. An electronic tuning system set forth in claim 7, wherein said current supplying means comprises a first current supply circuit for causing a current to flow in a first direction relative to said charge storage means and a second current supply circuit for causing a current to flow in a second direction opposite to said first direction relative to said charge storage means, and said control means connects said first current supply circuit to said charge storage means for a predetermined period from the time said discrimination signal exceeds said upper limit and connects said second current supply circuit to said charge storage means for a predetermined period from the time said discriminating voltage exceeds said lower limit.

9. An electronic tuning system as set forth in claim 7, further including other current supplying means and channel selector means, wherein said channel selector means through manual operation thereof causes said other current supplying means to be connected to said charge storage means and at the same time causes said control means to be in an inoperative state, to thereby cause said discriminating signal to depart from a range between said upper and lower limits in order to vary the charge voltage of said charge storage means to capture another broadcast signal, and wherein when said discriminating signal becomes equal to said center value, said other current supplying means is disconnected from said charge storage means, while said control means is restored to the operative state, to thereby capture said another broadcast signal.

10. An electronic tuning system set forth in claim 9, wherein a value of the current generated by said current supplying means is smaller than a value of the current produced by said other current supplying means.

11. An electronic tuning system set forth in claim 7, 8, 9 or 10, wherein said voltage generating means includes an amplifier circuit having a high input impedance, and said charge storage means is coupled between the input and the output of said amplifier.

12. An electronic tuning system in accordance with claim 11 wherein said charge storage means is a capacitor.

* * * * *